(12) United States Patent
Chen et al.

(10) Patent No.: US 6,376,269 B1
(45) Date of Patent: Apr. 23, 2002

(54) VERTICAL CAVITY SURFACE EMITTING LASER (VCSEL) USING BURIED BRAGG REFLECTORS AND METHOD FOR PRODUCING SAME

(75) Inventors: Yong Chen, Mountain View; Shin-Yuan Wang, Palo Alto, both of CA (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 09/243,184

(22) Filed: Feb. 2, 1999

(51) Int. Cl.[7] ............................................. H01L 21/00
(52) U.S. Cl. ........................... 438/29; 438/45; 438/46; 438/47; 372/45; 372/50; 372/98; 372/99
(58) Field of Search ............................... 438/22, 29, 45, 438/46, 47; 372/50, 43, 44, 45, 98, 99

(56) References Cited

U.S. PATENT DOCUMENTS

| | | | | |
|---|---|---|---|---|
| 4,943,970 A | * | 7/1990 | Bradley | |
| 5,404,370 A | * | 4/1995 | Otsubo et al. | |
| 5,757,837 A | * | 5/1998 | Lim et al. | |
| 5,991,326 A | * | 11/1999 | Yuen et al. | |

* cited by examiner

Primary Examiner—Long Pham

(57) ABSTRACT

A current confinement region located proximate to a pair of Bragg reflectors in a semiconductor laser and an epitaxial lateral overgrowth layer grown through an aperture in the current confinement region allows a desirable current flow in the laser. The placement of the current confinement region having an aperture formed therein allows the desired current flow through an active layer of the laser. This current flow allows the laser to achieve a single spatial mode output. Furthermore, the ability to place a pair of Bragg reflectors in close proximity to each other achieves a short optical cavity resulting in a single longitudinal mode output. Together, the single spatial mode and single longitudinal mode result in a desired single frequency output. The single frequency output is particularly useful for high speed, high rate optical and telecommunications.

14 Claims, 6 Drawing Sheets

VERTICAL CAVITY SURFACE EMITTING LASER (VCSEL) USING BURIED BRAGG REFLECTORS AND METHOD FOR PRODUCING SAME

TECHNICAL FIELD

The present invention relates generally to the fabrication of semiconductor lasers, and, more particularly, to both long and short wavelength vertical cavity surface emitting lasers (VCSEL) using Bragg reflectors buried in an indium phosphide (InP) material system or a gallium nitride (GaN) material system and a method for producing same.

BACKGROUND OF THE INVENTION

Light emitting diodes (LED's), lasers, and the like (collectively known as light emitting devices) are used widely in many applications today such as communications systems, medical systems, and display systems. These light emitting devices are commonly fabricated with epitaxial materials formed on a substrate, the epitaxial materials having a p-n junction, or active region, formed therein and typically include at least one Bragg reflector. A Bragg reflector is a fundamental building block of many light emitting devices. In LED's, a Bragg reflector is fabricated between an active region and a substrate to reflect light out of the LED, and in lasers, a Bragg reflector is fabricated on either side of an active region to define an optical cavity. In the case of an LED, light emitted from an active region toward the substrate is reflected by a Bragg reflector back toward the surface where it combines with the light going toward the surface, thus increasing the light output of the LED. Bragg reflectors are typically composed of alternating layers of material having different refractive indices. In a semiconductor laser, one Bragg reflector should have a reflectivity approaching 99.9% and the opposing Bragg reflector (i.e., the one through which the laser light is emitted) should have a reflectivity of approximately 99.8%.

For lasers used in communication systems, and particularly for optical communications systems, it is desirable for the laser to emit a relatively long wavelength light on the order of approximately 1.3–1.55 micrometers (am) and emit that light in a single spatial mode and in a single longitudinal mode. Laser emission in a single spatial mode and in a single longitudinal mode results in laser emission at a single frequency. A long wavelength, single frequency output allows the laser emission to be focused into an optical fiber and to perform well in communications systems in which very high communication rates over long distances at high frequencies are required.

Laser emission at these preferred wavelengths requires that a laser be fabricated of a material having a small band gap, such as indium phosphide. Unfortunately, it is difficult to form Bragg reflectors using indium phosphide because it is difficult to find a compatible material having a refractive index different than that of indium phosphide, thus requiring an inordinately large number of reflector pairs in order to achieve the required reflectivity.

One type of laser device that is capable of emitting a single frequency output at the desired communication frequency is a distributed feedback laser (DFB). However, distributed feedback lasers tend to be high in cost.

Another way of achieving a long wavelength laser emission is to grow Bragg reflectors using a gallium arsenide (GaAs) material system and then join the GaAs Bragg reflectors, using a technique known as wafer bonding, to an indium phosphate (InP) substrate. A significant drawback to this method is that, typically, there is poor electrical conductivity across the bonded interface. Another drawback to this method is that the joining of the two different material systems using wafer bonding adds a costly manufacturing step, and requires the growth of two different material systems.

Yet another method for creating a long wavelength laser without the use of wafer bonding is to use a GaAs semiconductor laser with an active layer comprising, for example, gallium arsenide nitride (GaAsN) or gallium arsenide phosphide antimonide (GaAsPSb), however, the growth of these active layers is difficult, costly and time consuming.

Therefore, an unaddressed need exists in the industry for a long wavelength single frequency laser that may be fabricated simply from a single material system at a low cost.

SUMMARY OF THE INVENTION

The invention provides a semiconductor laser and method for producing same. Although not limited to these particular applications, the present invention is applicable to forming an indium phosphide (InP), long wavelength semiconductor laser and also, semiconductor lasers fabricated from the gallium nitride (GaN) material system.

In architecture, the present invention may be conceptualized as a semiconductor laser, comprising a substrate assembly containing a first reflector, a current confinement region located on a surface of the substrate assembly, an epitaxial lateral overgrowth layer over the current confinement region, and a second reflector deposited over the substrate assembly.

The present invention may also be conceptualized as providing a method for forming a semiconductor laser, comprising the following steps: forming a substrate assembly containing a first reflector, forming a current confinement region located on a surface of the substrate assembly, growing an epitaxial lateral overgrowth layer over the current confinement region, and forming a second reflector over the substrate assembly.

The invention has numerous advantages, a few of which are delineated, hereafter, as merely examples.

An advantage of the invention is that it allows a semiconductor laser to emit a light output at a single spatial mode and a single longitudinal mode, resulting in a light output at a single frequency.

Another advantage of the invention is that it improves the current confinement capability of a semiconductor laser.

Another advantage of the invention is that allows a long wavelength semiconductor laser to be fabricated from a single material system.

Another advantage of the invention is that it allows a long wavelength semiconductor laser to be fabricated using commonly available materials with which to create the active region.

Another advantage of the invention is that it is simple in design and easily implemented on a mass scale for commercial production.

Other features and advantages of the invention will become apparent to one with skill in the art upon examination of the following drawings and detailed description. These additional features and advantages are intended to be included herein within the scope of the present invention.

BRIEF DESCRIPTION OF THE DRAWINGS

The present invention, as defined in the claims, can be better understood with reference to the following drawings.

The components within the drawings are not necessarily to scale relative to each other, emphasis instead being placed upon clearly illustrating the principles of the present invention.

DETAILED DESCRIPTION OF THE INVENTION

The invention to be described hereafter is applicable to semiconductor lasers formed using various material systems, however, for simplicity, a preferred embodiment will be described in the context of forming a long wavelength, indium phosphide semiconductor laser. It should be stressed that the principles of the present invention are applicable to other material systems as well. For example, the concepts of the present invention may be used in the fabrication of a gallium nitride semiconductor laser.

Furthermore, for simplicity in the description to follow, only the principal layers of the semiconductor laser device will be illustrated.

FIGS. 1A through 1E are a series of cross-sectional schematic views collectively illustrating the growth progression of a preferred embodiment of the indium phosphide semiconductor laser 10 constructed in accordance with the present invention.

Figure 1A:
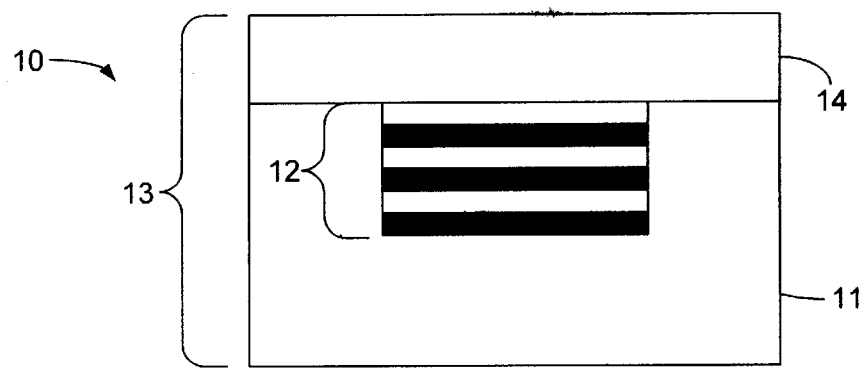
FIGS. 1A through 1E are cross-sectional schematic views collectively illustrating the growth progression of a semiconductor laser having a reflector buried within a substrate of indium phosphide (InP) in accordance with the present invention.

Turning now to FIG. 1A, Bragg reflector 12 is deposited within n-type indium phosphide substrate 11. Bragg reflector 12, as known in the art, may be comprised of alternating layers of silicon dioxide ($SiO_2$) and titanium dioxide ($TiO_2$) and is deposited within a trench etched in n-type indium phosphide substrate 11 using techniques such as evaporation. Alternatively, Bragg reflectors may be comprised of alternating layers of conductive material such as titanium nitride (TiN) and silicon carbide (SiC). Bragg reflectors comprised of conductive material may enhance current conduction when buried in indium phosphide, for example. Bragg reflector 12 has a reflectivity approaching 99.9%, and is typically comprised of approximately 5–20 layer pairs of silicon dioxide and titanium dioxide. Bragg reflector 12 is sometimes referred to as a Bragg mirror.

Over indium phosphide substrate 11 and Bragg reflector 12 is deposited an additional layer of n-type indium phosphide 14. Layer 14 completes the structure in which Bragg reflector 12 is enclosed, whereby n-type indium phosphide substrate 11, Bragg reflector 12 and n-type indium phosphide layer 14 form n-type indium phosphide substrate assembly 13. With respect to Bragg reflector 12, the difference in the refraction indices of the silicon dioxide and titanium dioxide material comprising the layer pairs determines the reflectivity of the layer pairs. The thickness of each layer of silicon dioxide and titanium dioxide is $\lambda/4n$ (or odd multiples thereof), where $\lambda$ is the in vacuo wavelength of light reflected and n is the refractive index of the material. Note that any odd inter multiple of $\lambda/4n$ may be used. For example, material thickness of $3\lambda/4n$ or $5\lambda/4n$ may be used as well.

Bragg reflector 12, in this preferred embodiment, has a reflectivity approaching 99.9% because light will be emitted from the top of the device. This requires that the Bragg reflector located opposite the direction of the light output (i.e., Bragg reflector 12) have maximum possible reflectivity.

Figure 1B:
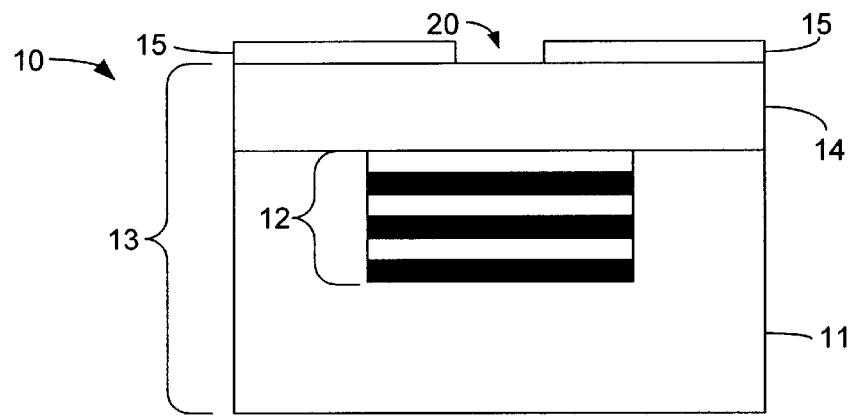

FIG. 1B illustrates the addition of current confining layer 15 over n-type indium phosphide layer 14. Current confining layer 15 is deposited over n-type indium phosphide layer 14 in a manner which defines an aperture 20 which is smaller than the extent of Bragg reflector 12. Current confinement layer 15 is formed by depositing a layer of current confining material over n-type indium phosphide layer 14, then removing a portion thereof which causes aperture 20 to be formed in the vicinity of Bragg reflector 12. Aperture 20 may be formed by photolithographic etching or photolithographic liftoff as known in the art. Aperture 20 is formed such that current confining layer 15 overlies the periphery of Bragg reflector 12 so that aperture 20 is located over part of Bragg reflector 12 as shown herein, thus forming a current confinement path, which will be illustrated in detail with respect to FIGS. 1D and 1E. It should be noted that while shown as residing concentrically over Bragg reflector 12, aperture 20 may reside anywhere over Bragg reflector 12.

Current confining layer 15 is illustratively formed using, for example, dielectric material such as silicon dioxide ($SiO2$), silicon nitride (SiN), carbonized organic material, or silicon carbide (SiC), or indeed may be formed using non-dielectric material such as a high bandgap semiconductor material. Typically, current confinement layer 15 will be formed using silicon carbide, silicon nitride, or silicon dioxide.

Figure 1C:
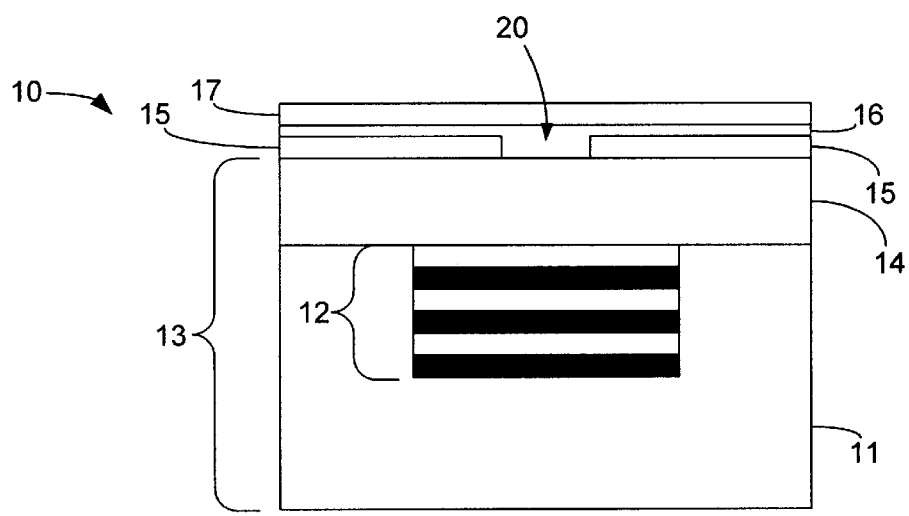

Turning now to FIG. 1C, it can be seen that n-type indium phosphide layer 16 is grown over current confining layer 15, thus enclosing current confining layer 15 within n type indium phosphide material. Note that layer 16 comprises an epitaxial lateral overgrowth layer that is grown within aperture 20 using n-type indium phosphide layer 14 as a seed layer. Layer 16 fills aperture 20 and then grows laterally over current confining layer 15, gaining thickness as it grows.

Over n-type indium phosphide layer 16 is deposited active layer 17. Active layer 17 is illustratively comprised of alternating layers of indium gallium arsenide phosphide (InGaAsP) and indium phosphide (InP), for example, forming multiple quantum wells.

Figure 1D:
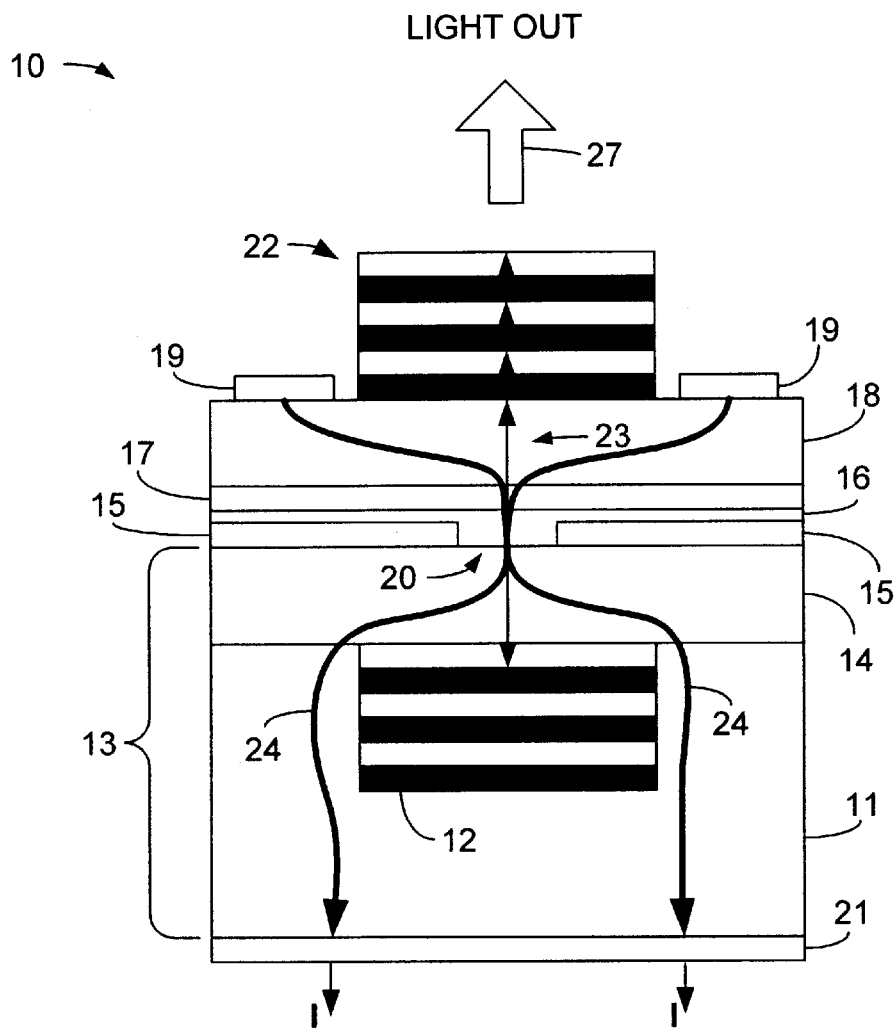

FIG. 1D illustrates a completed indium phosphide semiconductor laser device 10. Over active layer 17 is deposited a p-type layer of indium phosphide 18. Upon p-type indium phosphide layer 18 is deposited an additional Bragg reflector 22. Bragg reflector 22 is constructed similarly to Bragg reflector 12, however, Bragg reflector 22, while also comprising 5–20 alternating pairs of silicon dioxide and titanium dioxide layers, will typically have fewer pairs than Bragg reflector 12, thus resulting in a reflectivity of approximately 99.8%. The arrow 27 above Bragg reflector 22 indicates the light output of the semiconductor laser 10. Bragg reflector 22 is slightly less reflective than Bragg reflector 12 for the reason that light will be emitted through Bragg reflector 22 in the direction shown by the arrow.

Also deposited upon p-type indium phosphide layer 18 are p-ohmic contacts 19, while n-ohmic contact 21 is deposited on the bottom of n-type indium phosphide substrate 11.

To illustrate the effect of current confinement layer 15 having aperture 20 located over Bragg reflector 12, notice illustrative current paths 24 between n-ohmic contact 21 and p-ohmic contact 19. The flow of current between n-ohmic contact 21 and p-ohmic contact 19 results in light being generated within active layer 17 and amplified within optical cavity 23. Optical cavity 23 is the region between and including Bragg reflector 12 and Bragg reflector 22 in which the laser light generated in the active layer oscillates and is amplified. The light generated nearly completely reflects off Bragg reflector 12 and a small portion thereof passes through Bragg reflector 22 to be emitted as a single frequency output in the direction indicated by the arrow 27.

The location of aperture 20, in cooperation with the extension of current confining layer 15 over Bragg reflector 12 generates a very high current density in the region of the active layer corresponding to aperture 20 and between Bragg reflectors 12 and 22 so that the active layer may generate light that can be reflected by Bragg reflectors 12 and 22. The placement of the aperture as shown also aids in achieving a current density in the active layer sufficient to achieve the lasing threshold and also sufficient to achieve a uniform current density, which aids in achieving the desired single mode output. This desired current flow is illustrated by arrows 24. Notice that the current is concentrated toward the center of aperture 20. This current flow allows indium phosphide semiconductor laser device 10 to achieve a single spatial mode output. Furthermore, the ability to place Bragg reflector 12 and Bragg reflector 22 in close proximity to each other achieves a short optical cavity 23 resulting in a single longitudinal mode output. Together, the single spatial mode and single longitudinal mode result in the desired single frequency output.

Alternatively, the current confinement result achieved by the placement of current confining layer 15 having aperture 20 located in the vicinity of Bragg reflector 12 may be achieved through the use of ion implantation to create a current confining region in the n-type indium phosphide layer 14 proximate to Bragg reflector 12, which will be described in detail with respect to FIG. 1E.

Figure 1E:
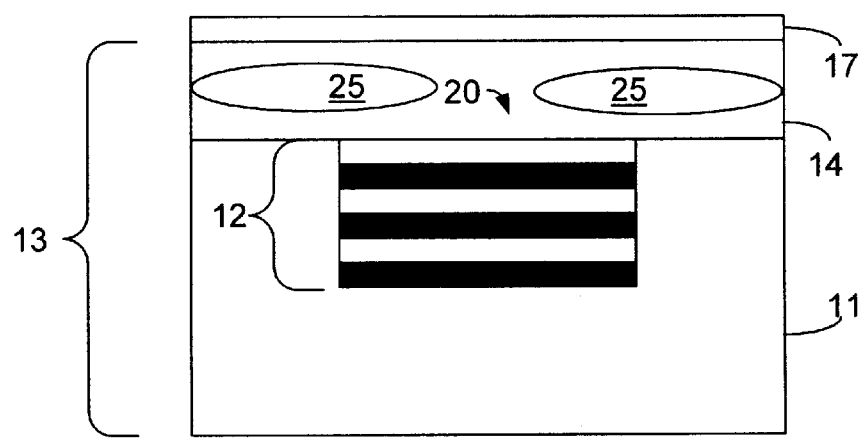

Referring to FIG. 1E ion implantation regions 25 are illustratively formed in n-type indium phosphide layer 14 adjacent to Bragg reflector 12. Ion implantation regions 25 form aperture 20 in the vicinity of Bragg reflector 12. Ion implantation regions 25 may be formed by implanting, for example hydrogen, oxygen, helium and iron ions as known by those skilled in the art. Whether aperture 20 is formed by a current confinement layer 15 or through the use of ion implantation, the result is that the current flow between p-ohmic contacts 19 and n-ohmic contact 21 is directed so as to maximize the current density in the active layer as described above, thus enabling a clean single frequency output.

FIGS. 2A through 2G are cross-sectional schematic views collectively illustrating the growth progression of an alternative embodiment of the semiconductor laser of FIGS. 1A through 1E.

Figure 2A:
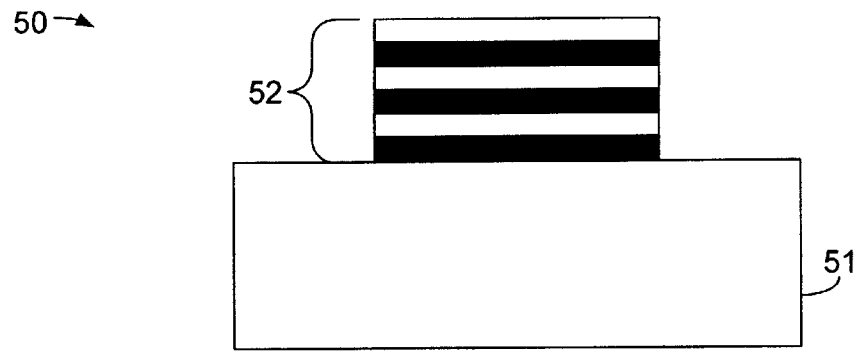
FIGS. 2A through 2G are cross-sectional schematic views collectively illustrating the growth progression of an alternative embodiment of the semiconductor laser of FIGS. 1A through 1E.

Turning now to FIG. 2A, shown is n-type indium phosphide substrate 51 upon which is deposited Bragg reflector 52. Because indium phosphide semiconductor laser 50 of this alternative embodiment will emit light through the bottom of the device, Bragg reflector 52 is similar in structure to Bragg reflector 22 of FIGS. 1A–1E, in that Bragg reflector 52 has a reflectivity approaching 99.8% so that it will pass output laser light. Bragg reflector 52 is illustratively comprised of 5–20 pairs of alternating layers of silicon dioxide and titanium dioxide.

Figure 2B:
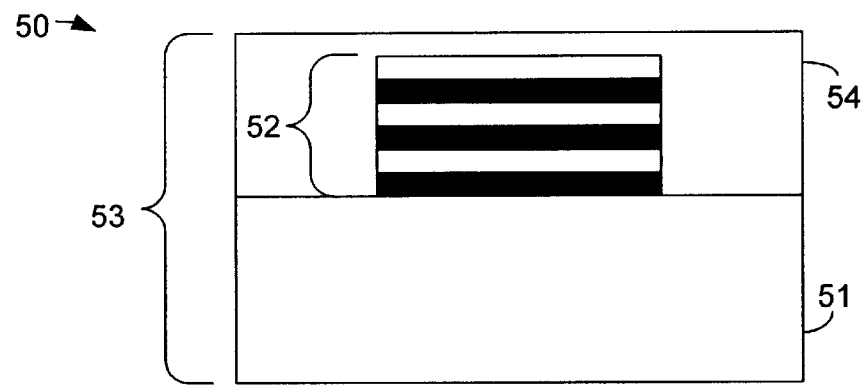

FIG. 2B illustrates the deposition of n-type indium phosphide epitaxial layer 54 over n-type indium phosphide substrate 51 and Bragg reflector 52, resulting in Bragg reflector 52 being completely enclosed, or buried, within n-type indium phosphide material, thus forming n-type indium phosphide substrate assembly 53.

Figure 2C:
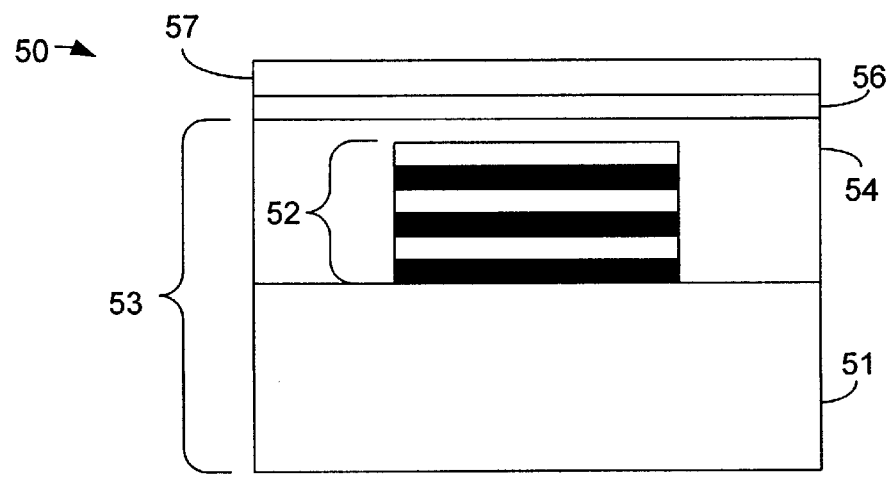

As can be seen in FIG. 2C, active layer 56, which comprises alternating layer pairs of indium gallium arsenide phosphide (InGaAsP) and indium phosphide (InP) for example, forming multiple quantum wells in a structure similar to that described with respect to FIG. 1C, is grown over indium phosphide epitaxial layer 54. Over active layer 56 is grown p-type indium phosphide layer 57.

Figure 2D:
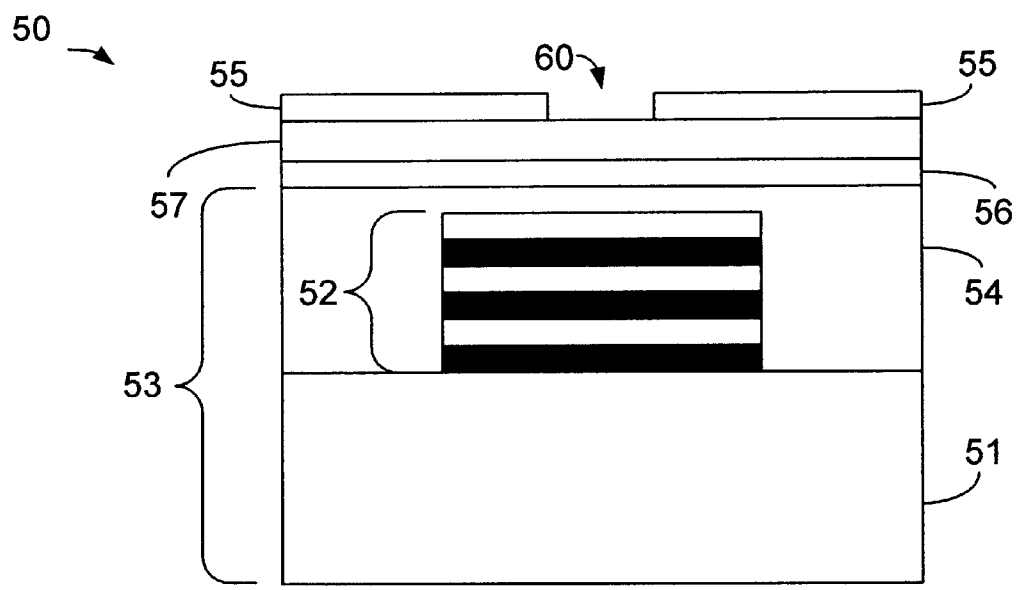

FIG. 2D shows the deposition of current confinement layer 55 over p-type indium phosphide layer 57. Current confinement layer 55 is deposited over p-type indium phosphide layer 57 in a manner which defines an aperture 60 which is smaller than the extent of Bragg reflector 52. Current confinement layer 55 is formed by depositing a layer of current confining material over p-type indium phosphide layer 57, then removing a portion thereof which causes aperture 60 to be formed in the vicinity of Bragg reflector 52. Aperture 60 may be formed by photolithographic etching or photolithographic liftoff as known in the art. As can be seen, current confinement layer 55 overlies the periphery of Bragg reflector 52 so that aperture 60 is located over part of Bragg reflector 52. Aperture 60 functions to direct current through active layer 56 as described with respect to FIGS. 1B, 1C and 1D. It should be noted that while shown as residing concentrically over Bragg reflector 52, aperture 60 may reside anywhere over Bragg reflector 52.

Figure 2E:
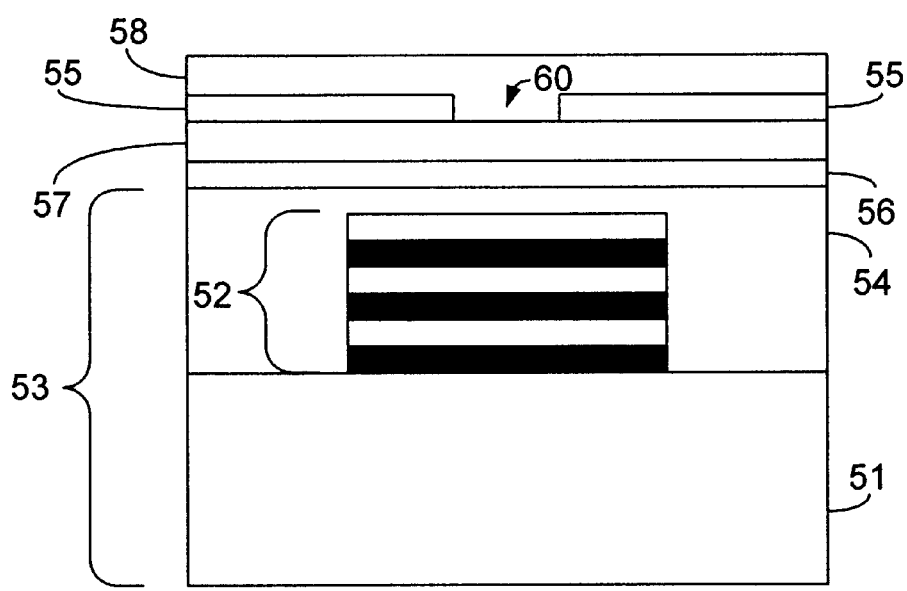

Referring now to FIG. 2E, shown is the deposition of p-type indium phosphide layer 58 over current confinement layer 55 and p-type indium phosphide layer 57. The deposition of p-type indium phosphide layer 58 is achieved using epitaxial lateral overgrowth beginning in aperture 60 and using p-type indium phosphide layer 57 as a seed layer from which to grow p-type indium phosphide layer 58 similar to that described with respect to FIG. 1C.

Figure 2F:
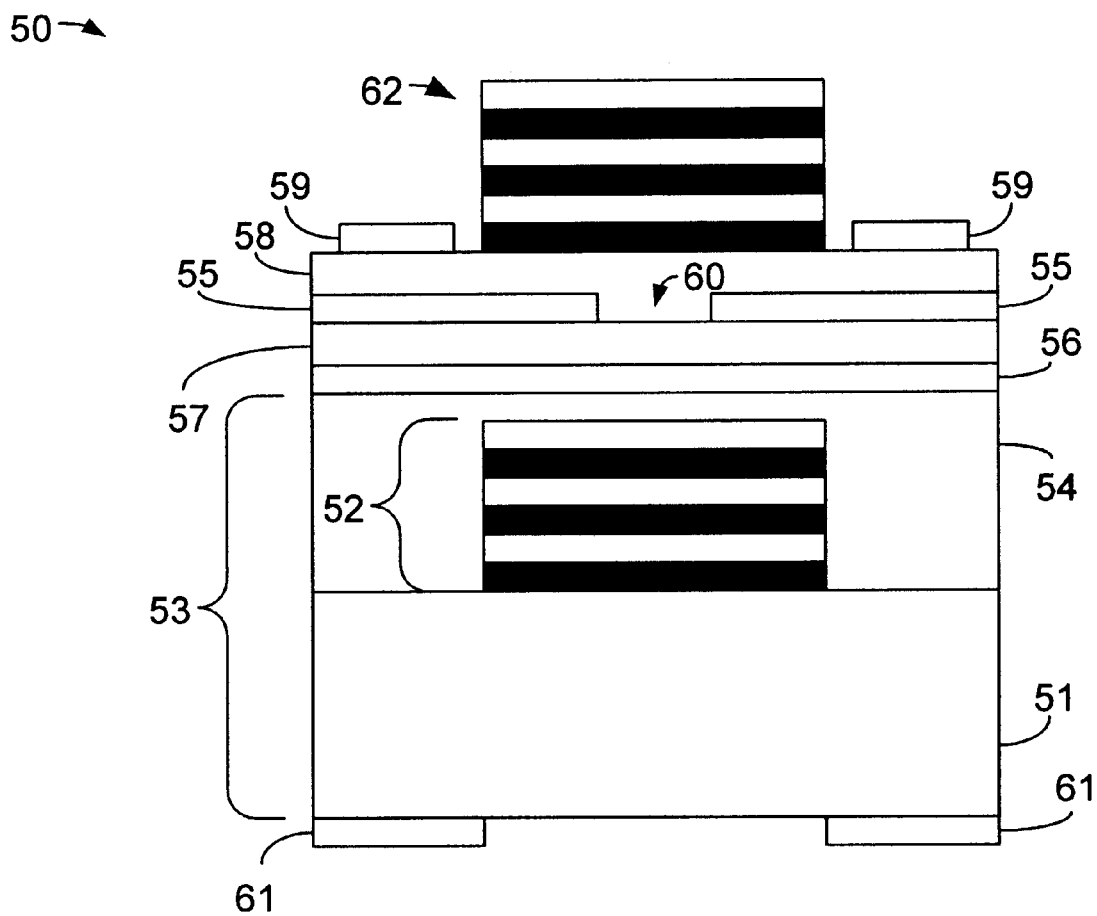

Shown in FIG. 2F is the deposition of Bragg reflector 62 over p-type indium phosphide layer 58. Bragg reflector 62 has a reflectivity approaching 99.9%, thereby achieving near total reflection. Bragg reflector 62 is similar in structure to Bragg reflector 12 of FIGS. 1A–1E, in that it is comprised of approximately 5–20 pairs of alternating layers of silicon dioxide and titanium dioxide. Bragg reflector 62 is nearly totally reflecting so that light generated in laser device 50 may be emitted through Bragg reflector 52 out of the bottom of the device in the direction of the arrow 68 shown in FIG. 2G. As stated above, Bragg reflector 52 is similar in structure to Bragg reflector 22 of FIG. 1D in that it has a reflectivity of approximately 99.8% and is comprised of approximately 5–20 layer pairs of silicon dioxide and titanium dioxide. Bragg reflectors 52 and 62 may also be formed using titanium nitride and silicon carbide as discussed above.

Still referring to FIG. 2F, also deposited over p-type indium phosphide layer 58 are p-ohmic contacts 59 and deposited on the bottom of n-type indium phosphide substrate 51 are n-ohmic contacts 61.

Figure 2G:
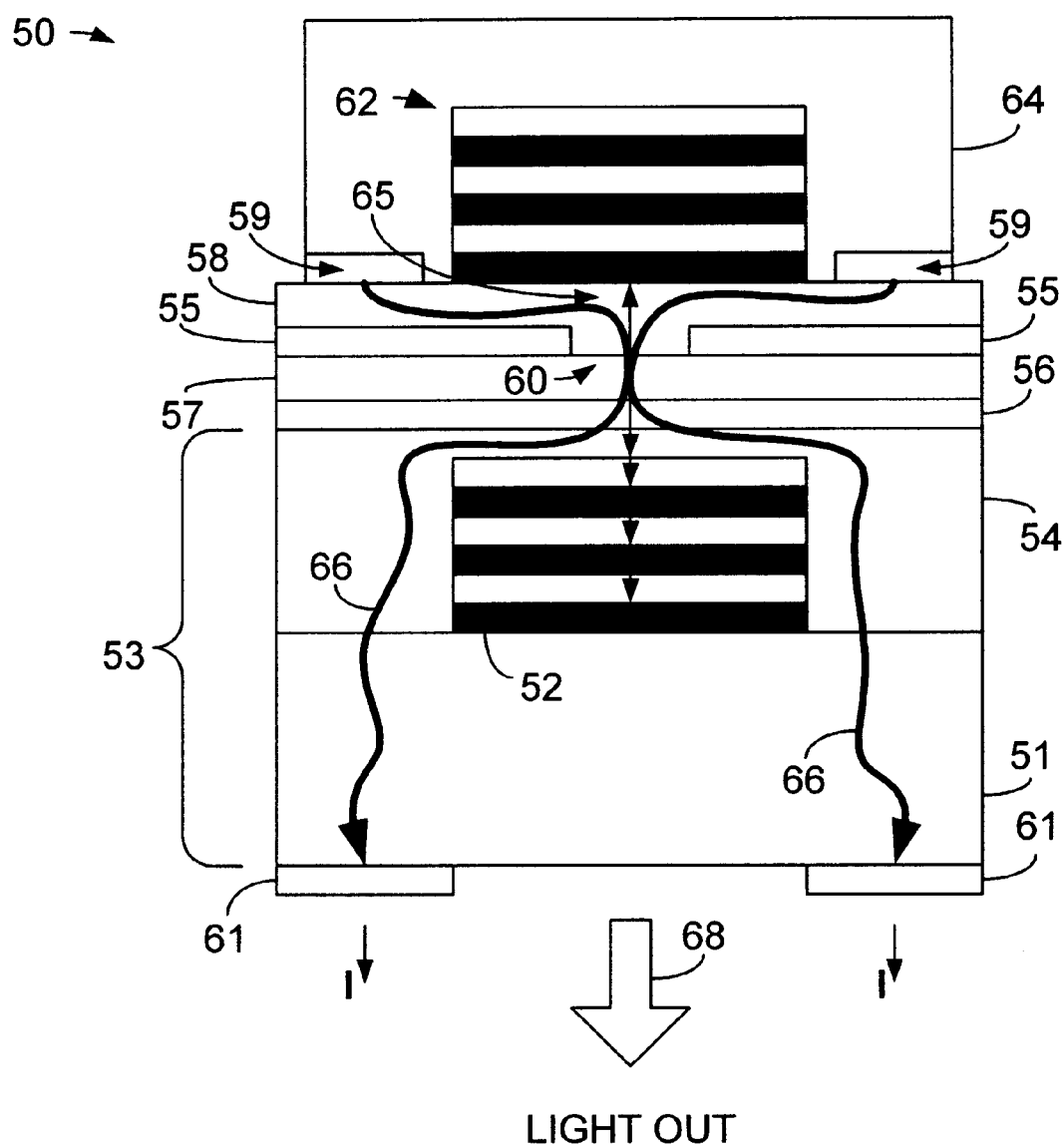

Referring now to FIG. 2G, it can been seen that gold (Au) plate layer 64 has been applied over p-ohmic contacts 59, Bragg reflector 62, and the portions of p-type indium phosphide layer 58 that are exposed between p-ohmic contacts 59 and Bragg reflector 62. Gold plate layer 64 provides heat sink capability for indium phosphide semiconductor laser 50. As illustrated in FIG. 2G, the flow of current, as indicated by paths 66 formed between n-ohmic contact 61 and p-ohmic contact 59 is channeled through the aperture 60 defined by current confinement layer 55 so as to enable the desired flow of current between n-ohmic contact 61 and p-ohmic contact 59. This arrangement results in light being generated within active layer 56 and amplified within optical cavity 65.

Optical cavity 65 is the region between and including Bragg reflector 52 and Bragg reflector 62 in which the laser light generated in the active layer oscillates and is amplified. The light generated nearly completely reflects off Bragg reflector 62 and a small portion thereof passes through Bragg reflector 52 to be emitted as a single frequency output in the direction indicated by the arrow 68.

The location of aperture 60, in cooperation with the extension of current confining layer 55 over Bragg reflector 52 generates a very high current density in the region of the active layer corresponding to aperture 60 and between Bragg reflectors 52 and 62 so that the active layer may generate light that can be reflected by Bragg reflectors 52 and 62. The placement of the aperture as shown also aids in achieving a current density in the active layer sufficient to achieve the lasing threshold and also sufficient to achieve a uniform current density, which aids in achieving the desired single mode output. This desired current flow is illustrated by arrows 66. Notice that the current is concentrated toward the center of aperture 60. The placement of current confinement layer 55 forming aperture 60 therein allows the desired current flow 66 through active layer 56. This current flow allows indium phosphide semiconductor laser device 50 to achieve a single spatial mode output. Furthermore, the ability to place Bragg reflector 52 and Bragg reflector 62 in close proximity to each other achieves a short optical cavity 65 resulting in a single longitudinal mode output. Together, the single spatial mode and single longitudinal mode result in the desired single frequency output in the direction shown by the arrow 68.

Although not shown with respect to FIGS. 2A–2G, the current confinement result achieved by current confinement layer 55 may also be achieved through the use of ion implantation in p-type indium phosphide layer 57, similar to that described with respect to FIG. 1E. The current confinement achieved through the placement of aperture 20 with respect to FIGS. 1A–1E, and the placement of aperture 60 with respect to FIGS. 2A–2E, together with the epitaxial lateral overgrowth through the aperture, using the layer of material beneath the current confinement layer as the seed material from which the epitaxial lateral overgrowth begins, allows the desired current flow within devices 20 and 50 respectively.

While the semiconductor laser devices of FIGS. 1A–1E and FIGS. 2A–2G respectively, show light output through the top of the device and the bottom of the device, it should be noted that, by reversing the placement of the mirrors and the heat sink of FIG. 2G, light may be emitted through opposite sides of the respective devices without departing from the scope of the present invention.

It will be obvious to those skilled in the art that many modifications and variations may be made to the preferred embodiments of the present invention, as set forth above, without departing substantially from the principles of the present invention. For example, the present invention can be used to fabricate various light emitting devices, and is equally applicable to growing layers of other Group III-V semiconductors in general. Furthermore, devices constructed in accordance with the present invention may be either top emitting or bottom emitting and may have all n-type and p-type material layers reversed. All such modifications and variations are intended to be included herein within the scope of the present invention, as defined in the claims that follow.

What is claimed is:

1. A method for forming a semiconductor laser, comprising the steps of:

forming a substrate;

forming in said substrate a first reflector having a first reflectivity;

forming a substrate assembly by enclosing said first reflector in said substrate;

forming a current confinement region located on a surface of said substrate assembly;

growing an epitaxial lateral overgrowth layer over said current confinement region; and forming a second reflector over said substrate assembly.

2. The method of claim 1, wherein said current confinement region forms an aperture proximate to said first reflector.

3. The method of claim 1, wherein said current confinement region comprises a dielectric layer.

4. The method of claim 1, wherein said current confinement region comprises a high bandgap semiconductor material.

5. The method of claim 1, wherein said substrate comprises indium phosphide.

6. The method of claim 1, wherein said substrate comprises gallium nitride.

7. The method of claim 1, wherein said current confinement region is formed by ion implantation.

8. The method of claim 7, wherein said ion implantation comprises ions selected from the group consisting of hydrogen, oxygen, helium and iron.

9. A method for forming an indium phosphide (InP), long wavelength semiconductor laser, comprising the steps of:

forming a substrate;

forming in said substrate a first reflector having a first reflectivity;

forming a substrate assembly by enclosing said first reflector in said substrate;

forming a second reflector having a second reflectivity;

forming a current confinement region in proximity to said first reflector, said current confinement region having an aperture defined therein and configured to direct a current flow within said laser, thus allowing an optical cavity formed between and including said first reflector and said second reflector to generate a desired lasing mode output; and growing an epitaxial lateral overgrowth layer through said aperture in said current confinement region.

10. The method of claim 9, wherein said current confinement region is formed within said substrate assembly.

11. The method of claim 9, wherein said current confinement region is formed by depositing a dielectric layer.

12. The method of claim 9, wherein said current confinement region is formed by depositing a high bandgap semiconductor material.

13. The method of claim 9, wherein said current confinement region is formed by ion implantation.

14. The method of claim 13, wherein said ion implantation comprises ions selected from the group consisting of hydrogen, oxygen, helium and iron.

* * * * *